US010063147B2

(12) United States Patent
Høyerby

(10) Patent No.: US 10,063,147 B2
(45) Date of Patent: Aug. 28, 2018

(54) MULTIPLE OUTPUT BOOST DC-DC POWER CONVERTER

(71) Applicant: Infineon Technologies Austria AG, Villach (AT)

(72) Inventor: Mikkel Høyerby, Herlev (DK)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/513,332

(22) PCT Filed: Sep. 25, 2015

(86) PCT No.: PCT/EP2015/072124
§ 371 (c)(1),
(2) Date: Mar. 22, 2017

(87) PCT Pub. No.: WO2016/050645
PCT Pub. Date: Apr. 7, 2016

(65) Prior Publication Data
US 2017/0331374 A1 Nov. 16, 2017

(30) Foreign Application Priority Data
Oct. 2, 2014 (EP) .................... 14187490

(51) Int. Cl.
*H02M 3/158* (2006.01)
*H02M 1/08* (2006.01)
(Continued)

(52) U.S. Cl.
CPC ............. *H02M 3/158* (2013.01); *H02M 1/08* (2013.01); *H02M 7/537* (2013.01); *H03F 3/183* (2013.01);
(Continued)

(58) Field of Classification Search
CPC .... H03F 3/45; H03F 3/45475; H03F 3/45174; H03F 3/45273; H03F 3/45372;
(Continued)

(56) References Cited

U.S. PATENT DOCUMENTS 5,715,153 A 2/1998 Lu
6,756,772 B2 6/2004 McGinnis
(Continued)

FOREIGN PATENT DOCUMENTS

EP 2544344 A1 1/2013
EP 2819290 A2 12/2014
(Continued)

OTHER PUBLICATIONS

Dancy et al.; "A Reconfigurable Dual Output Low Power Digital PWM Power Converter"; Low Power Electronics and Design, 1998; Proceedings, Aug. 10-12, 1998 International Symposium (6 pages).

*Primary Examiner* — Khanh V Nguyen
(74) *Attorney, Agent, or Firm* — Murphy, Bilak & Homiller, PLLC

(57) ABSTRACT

The present invention relates to a multiple output boost DC-DC power converter generating two, three or more separate DC output voltages, and to a multi-level power inverter and an alternating current generator both employing the multiple output boost DC-DC power converter.

20 Claims, 14 Drawing Sheets

(51) Int. Cl.
*H02M 7/537* (2006.01)
*H03F 3/217* (2006.01)
*H03F 3/183* (2006.01)
*H04R 3/00* (2006.01)
*H02M 1/00* (2006.01)
*H03F 1/02* (2006.01)

(52) U.S. Cl.
CPC ............... *H03F 3/217* (2013.01); *H04R 3/00* (2013.01); *H02M 2001/0083* (2013.01); *H03F 1/0211* (2013.01); *H03F 1/0244* (2013.01); *H03F 3/2171* (2013.01); *H03F 2200/03* (2013.01); *H03F 2200/504* (2013.01)

(58) Field of Classification Search
CPC ......... H03F 3/4547; H03F 2203/45054; H03F 2203/45096; H03F 2203/45124; H03F 3/45071; H03F 3/45183; H03F 3/45085; H03F 3/45179
USPC .................................................. 330/251, 297
See application file for complete search history.

(56) References Cited

U.S. PATENT DOCUMENTS

| | | | |
|---|---|---|---|
| 7,061,214 B2 | 6/2006 | Mayega | |
| 7,224,085 B2 | 5/2007 | Chen | |
| 7,626,445 B2 | 12/2009 | Lesso | |
| 7,786,712 B2 | 8/2010 | Williams | |
| 8,044,719 B2 * | 10/2011 | Norimatsu | H03F 3/217 330/251 |
| 8,049,561 B2 * | 11/2011 | Buter | H02M 3/07 330/251 |
| 8,289,082 B2 * | 10/2012 | Prohaska | H03F 3/45179 330/9 |
| 9,007,042 B2 * | 4/2015 | Okuda | H02M 3/158 323/271 |
| 9,602,020 B2 * | 3/2017 | Kondo | H02M 1/32 |
| 2010/0090764 A1 | 4/2010 | Buter | |
| 2010/0231298 A1 | 9/2010 | Norimatsu | |
| 2014/0043010 A1 | 2/2014 | Salem | |

FOREIGN PATENT DOCUMENTS

| | | |
|---|---|---|
| GB | 2475633 A | 5/2011 |
| JP | 2002-062858 A | 2/2002 |
| WO | 2015141348 A1 | 9/2015 |

* cited by examiner

MULTIPLE OUTPUT BOOST DC-DC POWER CONVERTER

CROSS-REFERENCE TO RELATED APPLICATIONS

This application is a U.S. National Stage of International Application No. PCT/EP2015/072124, filed Sep. 25, 2015, which claims the benefit of European Patent Application No. 14187490.9, filed Oct. 2, 2014, both of which are incorporated herein by reference in their entireties.

The present invention relates to a multiple output boost DC-DC power converter generating two, three or more separate DC output voltages, and to a multi-level power inverter and an alternating current generator both employing the multiple output boost DC-DC power converter.

BACKGROUND OF THE INVENTION

Energy extracted from energy sources such as sunlight and wind is not usually suitable for use in residential or industrial settings since most electrical equipment requires both relatively stable voltage amplitude, e.g. 120 V or 230 V, and a relatively stable frequency, e.g. 50 Hz or 60 Hz. However, power derived from sunlight or wind energy sources can be shaped to a stable alternating current (AC) using capacitive elements for smoothing, and power inverters for conversion from direct current/voltage (DC), typically via a battery, to alternating (ac) current/voltage. Other energy sources, such as fuel cells, also require power inverters in order to become suitable for powering AC equipment. In other cases, such as in the case of electric motors, a variable-frequency current is desirable. Battery-powered audio amplifiers also require a conversion from DC to a variable-frequency current.

Two-level and three-level inverters are most commonly used for converting current from a DC source to an AC current. Both types come in a variety of topologies each possessing its own set of advantages and drawbacks. In some situations, a three-level inverter will be advantageous. However, this type of inverters require three voltage levels, which in itself leads to more complex circuitry than two-level inverters. Furthermore, three-level inverters inherently require a higher minimum number of circuit components than two-level inverters do.

Power/energy efficient multiple output DC-DC power converters are generally desirable to decrease operational costs and minimize carbon footprint and may for instance be used in power inverters and AC power generators.

SUMMARY OF THE INVENTION

Various embodiments of the present invention provide a highly efficient multiple output boost DC-DC power converter with lower component count compared to prior art multiple output DC-DC power converters. By employing the present DC-DC power converter for instance in a multi-level inverter, the overall power inverter circuitry can be simplified.

A first aspect of the invention relates to a multiple output boost DC-DC power converter (100) comprising a semiconductor switch arrangement (101) comprising:
a first leg comprising N semiconductor switches connected in series, where N is an integer higher than 1, a first end of the first leg being connected to a DC reference potential, a second end of the first leg being connected to a boost node (222),
a second leg comprising N semiconductor switches connected in series, a first end of the second leg being connected to the boost node (222) and a second end of the second leg being connected to a first output node (224) for supplying a first DC output voltage (Pvdd) of the DC-DC power converter,
an inductor (211) having a first end connected to the boost node (222) and a second end connectable to a DC input voltage supply (Vdd),
a first capacitor (212) having a first end connected to a first intermediate node (221) of the first leg and having a second end connected to a second intermediate node (223) of the second leg,
a first further semiconductor switch (205) for selectively coupling or decoupling a second output node (225) to the first end of the first capacitor, for supplying a second DC output voltage (½Pvdd) via the second output node (225),
a second further semiconductor switch (206) for selectively coupling or decoupling the second output node (225) or, if present, a third output node (526) to the second end of the first capacitor (212),
a second capacitor (213) connected between the DC reference potential and the second output node (225),
a third capacitor (214) connected between the DC reference potential and the first output node (224);
a control circuit (102) coupled to respective control terminals of the semiconductor switches of the semiconductor switch arrangement (101), the control circuit (102) being configured to:
place the semiconductor switch arrangement (101) in a first charge configuration for charging the inductor (211) through a first current path extending from the boost node (222) to at least one of the second output node (225) and the DC reference potential,
place the semiconductor switch arrangement (101) in a first discharge configuration for discharging the inductor (211) through a second current path extending through the first capacitor (212) to the second output node (225),
place the semiconductor switch arrangement (101) in a second discharge configuration for discharging the inductor (211) through a third current path extending from the boost node (222) either directly to the first output node (224) through the second leg or through the first capacitor (212) and further through at least one semiconductor switch of the first leg and one semiconductor switch of the second leg.

The topology of the present multiple output boost DC-DC power converter may be viewed as a hybrid converter topology mixing features and operational characteristics of charge pumps and switched mode boost DC-DC power converters leading to a novel and efficient power converter topology as explained in further detail below.

According to one embodiment, the control circuit (102) is configured to:
place the first capacitor (212) and the second capacitor (213) in series via the semiconductor switch arrangement (101) in at least one of the first and second discharge configurations; and
place the first capacitor (212) and the second capacitor (213) in parallel via the semiconductor switch arrangement (101) in at least the first charge configuration.

Each of the semiconductor switches of the the semiconductor switch arrangement may for instance comprise one or more field effect transistors (FETs), bipolar junction transistors (BJTs), insulated gate bipolar transistors (IGBTs) or the like, or a combination thereof. The FETs may be either of an enhancement-mode type or of a depletion-mode type. One or more of the FETs could for instance comprise metal-oxide-semiconductor field-effect transistors (MOSFETs). It is also possible to configure the circuit with at least one of the semiconductor switches being a diode. Other related component types might also be suitable as semiconductor switches in the semiconductor switch arrangement in some embodiments of the multi-level boost DC-DC power converter.

In an embodiment of the multiple output boost DC-DC power converter, one or more of the semiconductor switches of the semiconductor switch arrangement comprise a MOSFET. In that case, the source of the MOSFET in question may act as the first end of that particular semiconductor switch, and the drain of the MOSFET may act as the second end of that particular semiconductor switch. The control circuit will be connected to a gate of the MOSFET and control a gate voltage or potential of the MOSFET in order to switch the MOSFET between its conducting state/on-state and its non-conducting state/off-state.

Similarly, a particular semiconductor switch in the semiconductor switch arrangement might be an IGBT, preferably with a parallel diode. In that case, the emitter of that IGBT can act as the first end of that particular semiconductor switch, and the collector of that IGBT can act as the second end of that particular semiconductor switch. The control circuit will control that IGBT's gate potential in order to switch that IGBT between its conducting state and its non-conducting state.

In some embodiments, the first, second, and fifth semiconductor switches comprise n-channel FETs and the third, fourth and sixth semiconductor switches comprise p-channel FETs. In some embodiments, each of the first, second, third, fourth, fifth and sixth semiconductor switches comprises an n-channel MOSFET or an IGBT.

Certain embodiments of the present multiple output boost DC-DC power converter comprises a first regime of operation and a second regime of operation that are utilized at different relative DC voltage levels of the DC input voltage supply and the first DC output voltage. Each of the first and second regimes of operation comprises a predetermined set of states of the semiconductor switch arrangement. According to this embodiment, the control circuit is configured to in the first regime of operation where the first output voltage (Pvdd) is smaller than two times the DC input voltage supply (Vdd):

place the semiconductor switch arrangement (101) in a first converter state for charging the inductor (211) through a first current path extending from the boost node (222) to the second output node (225) and through a second current path extending from the boost node (222) through the first capacitor (212) to the first output node (224); and to place the semiconductor switch arrangement in a second converter state for discharging the inductor (211) through a third current path extending from the boost node (222) to the first output node (225) and through a fourth current path extending from the boost node (222) through the first capacitor (212) to the second output node (213), place the semiconductor switch arrangement (101) in a third converter state for charging the inductor (211) through a fifth current path extending from the boost node (222) to the second output node (225) and through a sixth current path extending from the boost node (222) through the first capacitor (212) to the DC reference potential;

or to, in the second regime of operation where the first output voltage (Pvdd) is larger than two times the DC input voltage supply (Vdd):

place the semiconductor switch arrangement (101) in fourth converter state for charging the inductor (211) through a seventh current path extending from the boost node (222) to the DC reference potential and through an eight current path extending from the boost node (222) through the first capacitor (212) to the second output node (225), and to place the semiconductor switch arrangement in the third converter state for discharging the inductor (211) through the fifth and sixth current paths, and to place the semiconductor switch arrangement (101) in the first converter state for discharging the inductor (211) through the first and second current paths.

The operation of the multiple output boost DC-DC power converter in the first and second regimes of operation is discussed in further detail below with reference to the appended drawings.

Certain embodiments of the multiple output boost DC-DC power converter may be operated with a pre-defined cyclic transition through three separate converter states during each of the first and second regimes of operation as discussed in further detail below with reference to the appended drawings. The control circuit is configured, or operable to, cause the DC-DC power converter to switch between the first, second and third converter states in accordance with a pre-defined sequential scheme of: first converter state, second converter state, third converter state, second converter state, first converter state. In such an embodiment, the control circuit is operable to cause the DC-DC converter to sequentially operate in the first converter state, then switch to the second converter state, then switch to the third converter state, then switch to the second converter state and thereafter switch back to the first converter state, in that order.

The voltage level of the first DC output voltage tends towards twice the voltage level of the second DC output voltage by operation of the present multiple output boost DC-DC power converter due to the charge pump activity of the present power converter as discussed in further detail below with reference to the appended drawings. The DC-DC power converter may be adapted to provide a second DC output voltage which has a DC voltage level that substantially equals one half of the voltage level of the first DC output voltage. While it is possible to operate away from this condition it will generally be at a price of reduced conversion efficiency and often more complicated state switching/transitioning schemes, possibly involving additional converter states.

In some embodiments, the respective capacitances of the first, second and third capacitors are in the interval 1 nF-10 µF. In some embodiments, the capacitance of the second capacitor or the capacitance of the third capacitor differs from the capacitance of the first capacitor by less than 50%, or less than 10%, or less than 5%, or less than 2%, or less than 1%. In some embodiments, the capacitance of the second capacitor and the capacitance of the third capacitor differ from the capacitance of the first capacitor by less than 50%, or less than 10%, or less than 5%, or less than 2%, or less than 1%.

In some embodiments, the capacitance of the third capacitor differ from the capacitance of the second capacitor by less than 50%, or less than 10%, or less than 5%, or less than 2%, or less than 1%.

In some embodiments, an inductance of the boost inductor lies between 10 nH and 10 µH. A switching frequency of each of N semiconductor switches of the first leg, each of N semiconductor switches of the second leg and each of the first and second further semiconductor switches may be identical and lie in the interval 1 kHz-10 MHz, such as in the interval 10 kHz-10 MHz, such as in the interval 10 kHz-1 MHz.

The present multiple output boost DC-DC power converter may in certain embodiments operate without a voltage regulation loop. This is particularly convenient in applications where the respective loads on the first and second DC output voltages are known and fixed, the voltage of the DC input voltage supply is known and the target or desired DC voltages of the first and second DC output voltages are known. In the latter type of applications, the control circuit may be configured to provide an appropriate cycle of state switching by applying fixed pulse-width modulated (PWM) signals to the respective control terminals of the N semiconductor switches of the first leg, the N semiconductor switches of the second leg and each of the first and second further semiconductor switches.

Alternatively, other embodiments of the present multiple output boost DC-DC power converter may comprises a voltage regulation loop to more accurately control the respective DC voltage levels of the first and second DC output voltages despite load variations and variations of the voltage of the DC input voltage supply. The voltage regulation loop may comprise a feedback loop or a feedforward loop or any combination thereof. The voltage regulation loop may be configured to minimize a difference between the target DC voltage and a signal representing one of: the first DC output voltage, the second DC output voltage or, if present, the third DC output voltage.

Hence, some embodiments of the present multiple output boost DC-DC power converter may comprise:
- a voltage controller having a first input coupled to the first, second or third output node and having a second input coupled to receive the DC target voltage, the voltage controller providing a modulation signal representing said difference,
- a pulse-width modulator for generating two or more pulse-width modulated (PWM) signals based on the modulation signal from the voltage controller and based on a ramp signal, wherein a duty cycle of the pulse-width modulated signals change in response to the modulation signal in a direction acting to minimize said difference, and
- a gate driver adapted to receive the pulse-width modulated signals and generate gate control signals based thereon, the gate control signals being adapted to make the DC-DC power converter operable to place the semiconductor switch arrangement in at least two of: the first configuration, the second configuration, the third configuration, the fourth configuration.

A gate driver of the control circuit may be adapted to receive the pulse-width modulated signal and generate gate control signals based thereon, the gate control signals being adapted to make the DC-DC power converter operable to place the semiconductor switch arrangement in at least two of the above-described described configurations.

In one embodiment, the control circuit provides two, respectively three, PWM signals phase shifted with respect to one another by 180 degrees and 120 degrees, respectively.

The gate driver provides gate control signals for the semiconductor switches of the semiconductor switch arrangement based on the two, respectively three, PWM signals.

The control circuit may also generate a further pulse-modulated signal for use by the gate driver in generating the gate control signals.

A second aspect of the invention provides a multi-level power inverter comprising:
- a multiple output DC-DC power converter in accordance any of above embodiments of multiple output boost DC-DC power converter in accordance with the first aspect of the invention, and
- inverter circuitry connected to the DC reference potential and to at least the first and second DC output voltage of the multiple output DC-DC power converter, and adapted to provide an alternating current output (AC) based thereon.

The power inverter can be used for instance to drive an electric motor or in an audio amplifier. Audio amplifiers may also benefit from a multi-level (such as three-level) output of some embodiments of the multiple output boost DC-DC power converter provided by the present invention. The power inverter may for instance use an embodiment of the boost DC-DC power converter that provides three output levels. Alternatively, the power inverter may be configured to operate with four or more levels from an embodiment of the boost DC-DC power converter.

A third aspect of the invention provides an AC power generator comprising:
- a multi-level power inverter in accordance with an embodiment of the multi-level power inverter of the second aspect of the invention, and
- a power source (1601) connected as input voltage supply to the multi-level power inverter.

The multi-level power inverter can for instance be based on three or four output levels, or higher.

The power generator could for instance be a wind turbine, a solar panel or the like, or derive energy from another renewable or non-renewable energy source. The power generator could for instance be a battery in a vehicle, where the battery is charged when kinetic energy of the vehicle is reduced, for instance during a braking of the vehicle.

A fourth aspect of the invention provides a class D audio power amplifier. The class D audio power amplifier comprises a multiple output DC-DC power converter in accordance with the first aspect of the invention, and further comprises an audio circuit having at least a first (GND), a second (PVdd) and a third (½Pvdd) voltage supply rail coupled respectively to: the DC reference potential, the first DC output voltage and the second DC output voltage. The audio circuit furthermore has an output connectable to a speaker load.

Even though the invention has been described with respect to a DC input voltage, the DC-DC power converter according to the invention can be operated to take into account a degree of variation in the input voltage.

BRIEF DESCRIPTION OF THE DRAWINGS

FIG. 12b illustrates schematically a control circuit for producing the gate control signals of FIG. 12a;

FIG. 14b illustrates schematically a control circuit for producing the gate control signals of FIG. 14a;

DETAILED DESCRIPTION OF PREFERRED EMBODIMENTS

In the following, embodiments of the invention will be described with reference to the accompanying drawings. The description and drawings are for illustrative purposes, and the particular embodiments discussed below shall not be considered as limiting the scope of the patent claims.

Figure 1:
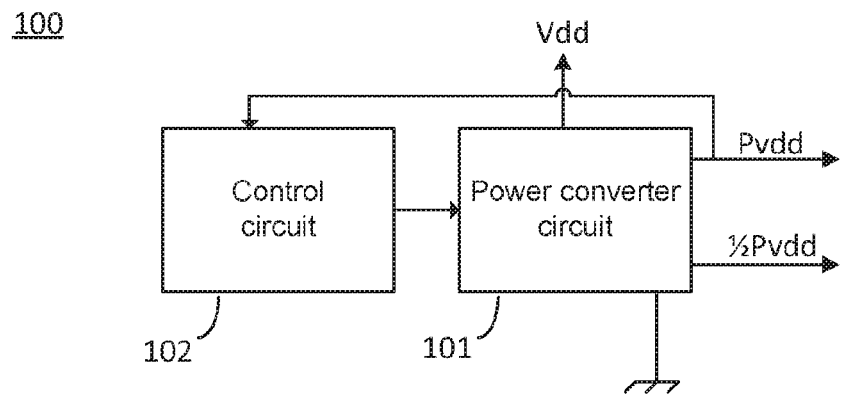
FIG. 1 illustrates a dual-output boost DC-DC power converter in accordance with a first embodiment of the invention.

FIG. 1 illustrates an embodiment of a dual-output boost DC-DC power converter 100 in accordance with a first embodiment of the invention. The dual-output boost DC-DC power converter 100 comprises a power converter circuit 101 and a control circuit 102 for controlling the operation of the DC-DC power converter circuit 101. The power converter circuit 101 is connected to an input power or input voltage supply Vdd which supply energy for the dual-output boost DC-DC power converter 100. The DC-DC power converter 100 is configured to generate separate first and second DC output voltages of different DC levels, Pvdd and ½Pvdd, respectively. The voltage level of the second DC output voltage is approximately half of the first DC output voltage as indicated by the factor ½. This feature is a noteworthy characteristic of the power converter circuit 100 enabled by the hybrid converter topology mixing operational characteristics of charge pumps and operational characteristics of switched mode boost DC-DC power converters leading to a novel and efficient power converter topology as explained in further detail below. The present embodiments of the DC-DC power converter 100 comprises an optional feedback voltage regulation loop including the control circuit 102 allowing accurate setting and continuous tracking of the respective DC output voltage levels of the first and second DC output voltages Pvdd and ½ Pvdd despite DC input voltage, load, temperature and circuit component variations over time.

Figure 2:
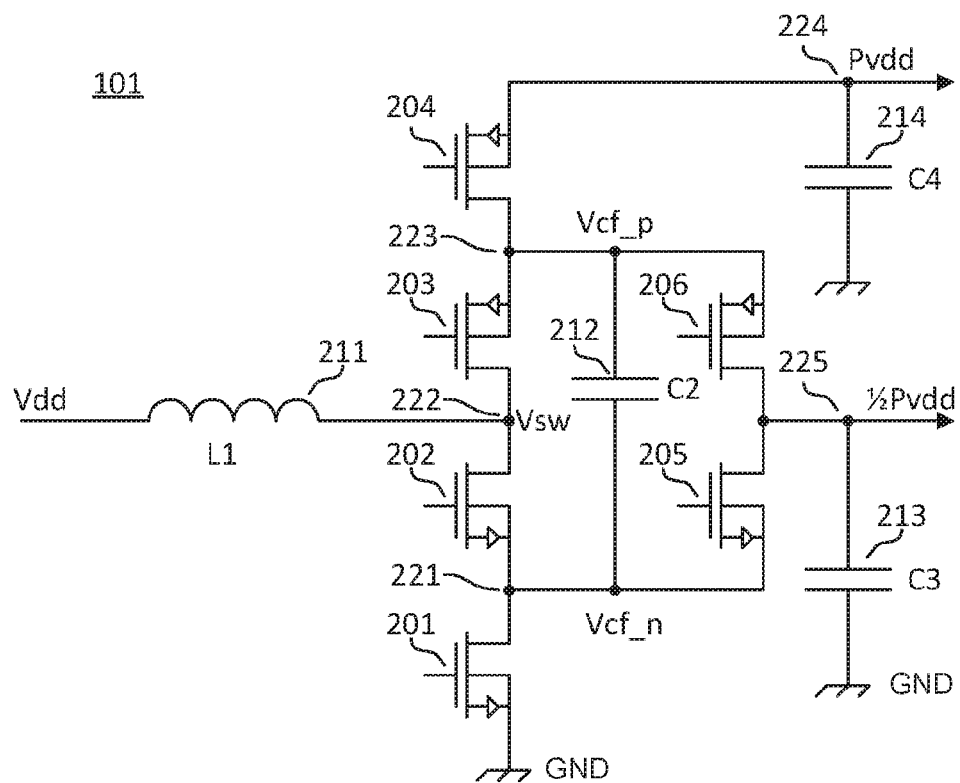
FIG. 2 illustrates a transistor level block diagram of the dual-output boost DC-DC power converter circuit depicted on FIG. 1.

FIG. 2 illustrates an exemplary transistor level schematic of the power converter circuit 101 depicted in simplified schematic form in FIG. 1. The exemplary power converter circuit 101 comprises a semiconductor switch arrangement comprising six controllable semiconductor switches 201-206. Each of the controllable semiconductor switches 201-206 may for example comprise a NMOS FET and/or PMOS FET transistor as indicated in the figure. The switches 201, 202 and 205 are preferably n-type switches, and switches 203, 204 and 206 are preferably p-type switches, for instance pMOSFETs. The selection of switches is a matter of design and is something that would advantageously be selected in such a way as to optimize the circuit for its intended application, for example in terms of DC voltage levels and voltage polarities.

The semiconductor switch arrangement comprises a first leg comprising first and second semiconductor switches 201, 202 connected in series or cascade between a DC reference potential, i.e. ground/GND in the present embodiment but may be a negative DC supply rail in other embodiments, and a boost node 222. The semiconductor switch arrangement further comprises a second leg comprising third and fourth semiconductor switches 203, 204 connected in series or cascade between the boost node 222 and the first DC output voltage Pvdd. The first leg comprises a first intermediate node 221 placed at the junction node of the first and second semiconductor switches 201, 202 and the second leg likewise comprises a second intermediate node 223 placed at the junction or coupling node of the third and fourth semiconductor switches 203, 204. The boost inductor L1 has a first end coupled to a DC input voltage supply Vdd and a second end coupled to the boost node 222. A flying or pump capacitor C2 is coupled between the first intermediate node 221 and second intermediate node 223 such that a first end of C2 is coupled to the first intermediate node 221 and a second end coupled to the second intermediate node 223. As discussed in further detail below, the semiconductor switch arrangement comprises a first further semiconductor switch 205, i.e. fifth switch of the present embodiment, is configured to selectively connecting and disconnecting a second output node 225, supplying the second DC output voltage ½Pvdd, to the first end of the first capacitor and hence to the first intermediate node 221. A second further semiconductor switch 206, i.e. sixth switch of the present embodiment, is configured for selectively connecting and disconnecting the second output node 225 or, if present, a third output node 526 to the second end of the first capacitor 212 and hence to the second intermediate node 223.

Figure 3:
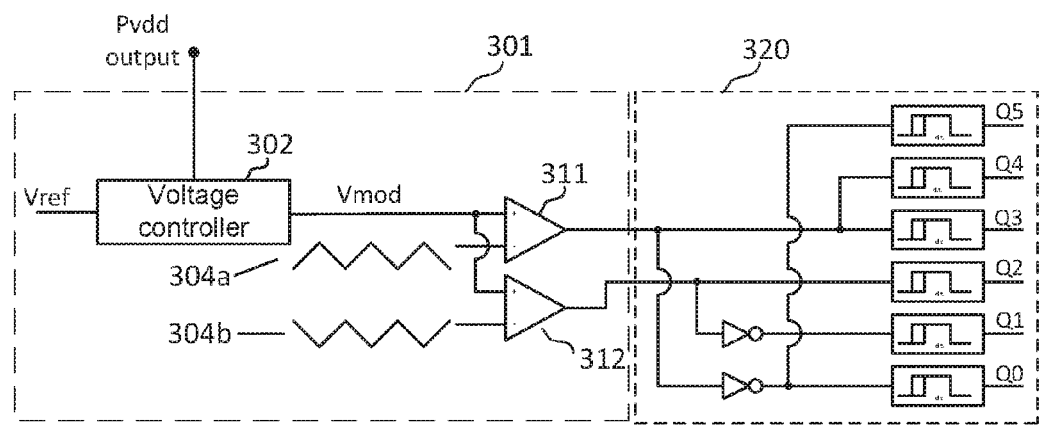
FIG. 3 illustrates schematically a control circuit of the dual-output boost DC-DC power converter depicted on FIG. 1.

FIG. 3 illustrates the control circuit 102 configured for switching the dual-output boost DC-DC power converter 100 between first, second and third converter states. The control circuit 102 comprises a pulse-width modulator 301 and a gate driver, schematically shown as element 320. More details about the control circuit 102 are discussed later in the specification. The control circuit 102 is configured to generate respective gate control signals Q0-Q5 for the controllable semiconductor switches 201-206 and hence controls the switching between the converter states.

Three-Level Output Boost DC-DC Converter Operation:

In the following section, the voltage conversion operation of the present embodiment of the dual-output boost DC-DC power converter 100 is described in terms of first, second, third and fourth converter states and how the switching among these converter states may be carried out. The dual-output boost DC-DC power converter 100 comprises two separate regimes of operation as described separately in the following section. However, the two operation regimes utilize the same converter circuitry 101. A common feature of the two different regimes is that (referring to FIG. 2) during power converter operation, especially in certain preferred embodiments, smoothing capacitors C4 and C3, connected to the first and second output nodes, 225, 224, respectively, provide DC voltage levels which are substantially Pvdd and ½ Pvdd, respectively.

Furthermore, the switching scheme of the pump or floating capacitor C2 enables the above-mentioned desired DC voltage level relationship between the first DC output voltage and the second DC output voltage because the control circuit (102) may be configured to alternatingly place the pump or floating capacitor C2 and the smoothing capacitor C3 in series in at least one of the discharge states of the boost inductor L1 via the semiconductor switch arrangement 101 and place C2 and C3 in parallel via the semiconductor switch arrangement 101 in at least one of the charge states of the boost inductor L1. The first DC output voltage Pvdd is available at first output node 224 while the second DC output voltage is available at second output node 225 as ½Pvdd. The converter state switching is adapted such that the desired or target voltage levels of the first and second DC output voltages are reached and maintained during operation of the power converter. These DC voltage levels can be obtained in at least one out of two ways, depending on the desired output voltages.

Many embodiments of the boost DC-DC dual-output converter have the noteworthy advantage that each of the semiconductor switches of the semiconductor switch arrangement (101) is subjected to a maximum voltage difference of ½Pvdd instead of the full DC supply voltage Pvdd hence significantly reducing the voltage stress of the individual semiconductor switches.

Regime 1: Pvdd<2*Vdd

In the following, the operation of the DC-DC power conversion is described in terms of preferred sets of converter states and a preferred switching between these converter states for the case where the DC voltage level of the first DC output voltage, Pvdd, is smaller than 2 times the DC voltage level of the input voltage supply, Vdd. The operation in Regime 1 applies particularly when the dual-output DC-DC power converter 100 operates normally, that is, where the voltage levels of the first and second DC output voltages are in vicinity of the target DC output voltages. During a pre-charge or startup phase, the boundary conditions are different compared to the normal operation of DC-DC voltage converter. However, the same underlying switching pattern can be used at startup.

The operation is described below and starting arbitrarily with the DC-DC power converter 100 arranged in a first converter state. The skilled person will understand that when a load is applied at the first and/or second DC output voltages, the converter energy reservoirs, such as smoothing capacitors C3 and C4 (and further below also C5) in the present case, are discharged partially. This leads to a corresponding decrease or reduction of each of the first and second DC output voltages. The feedback and switching between the converter states as controlled by the control circuit ensure replenishment of energy or power to the smoothing capacitors and other energy reservoirs. Thus, the first, second and third DC output voltages discussed below are nominal target voltages. In practice these DC voltages vary slightly to a degree that can be controlled according to desired requirements. Never the less, the first, second and third DC output voltages are preferably maintained near the respective target DC voltages via the described switching operations. This is well known to a person skilled in the art, and therefore the term "substantially" refers to the maintaining of DC output voltages near desired nominal values. A deviation from the nominal target voltage for a given one of the DC voltage outputs of 1% might in some cases be acceptable. In some cases, it might be desirable to maintain the deviation even lower, while in other cases a deviation within 2% or within 5% or within 10% might be acceptable.

The skilled person will also understand that the maintenance of the respective DC output voltages may be required only during certain periods where the DC-DC power converter is required to deliver stable DC output voltages. In a power-up or power-down phase of the power converter, the DC output voltages may for example deviate markedly from the target output voltages. The target DC output voltages may for example be maintained by the previously discussed voltage regulation loop. The voltage regulation loop can for instance be configured to minimize a difference between a DC target voltage and one of: the first DC output voltage, the second DC output voltage or, if present, the third DC output voltage. For instance, the DC target voltage might be compared to the first DC output voltage, and the switching between converter states be initiated when a difference between the DC target voltage and the first DC output voltage reaches or exceeds a threshold. The comparison could alternatively be based on the second DC output voltage or on the third DC output voltage.

Figure 4:
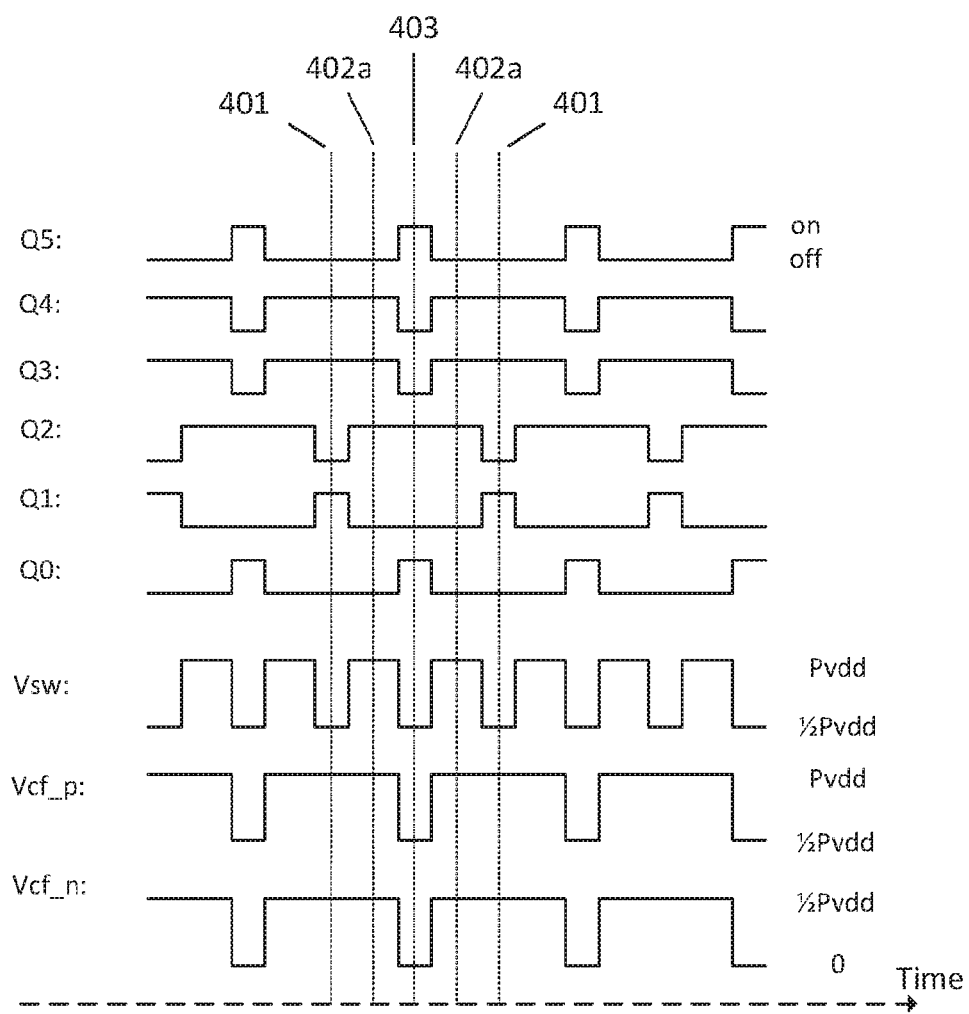
FIG. 4 illustrates gate control signals provided by the control circuit of FIG. 3.
Figure 5:
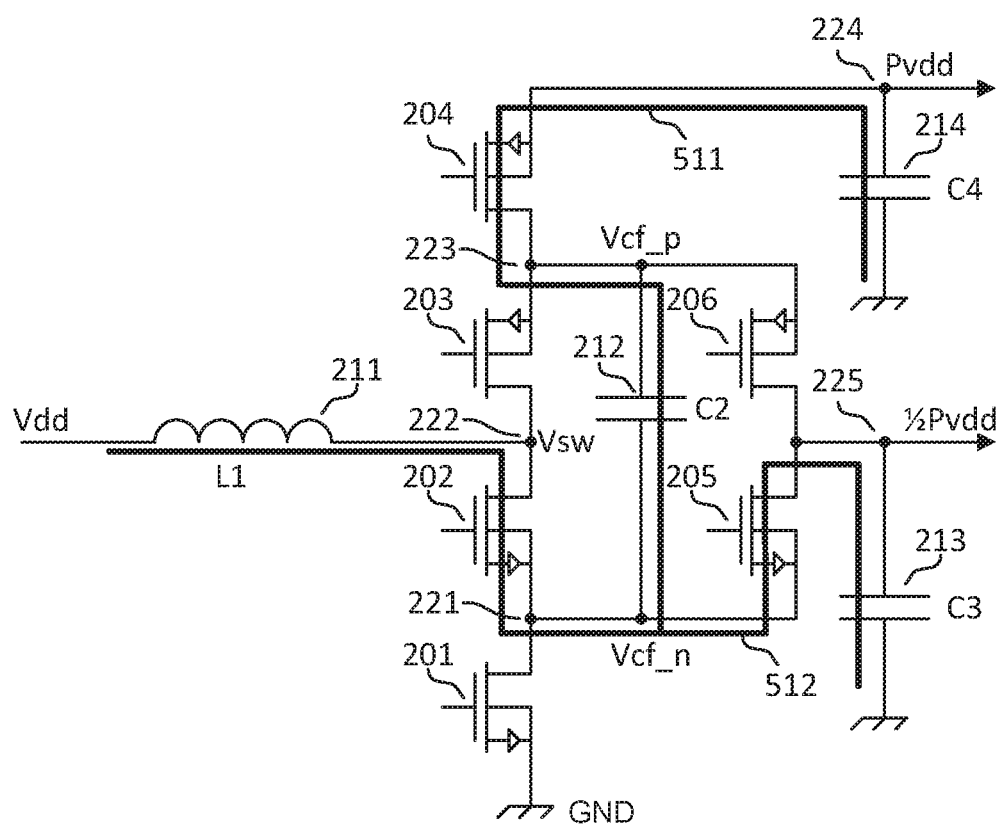
FIGS. 5-7 illustrate respective current or conducting paths of first, second and third converter states of the dual-output boost DC-DC power converter depicted on FIG. 1 during operation thereof.

FIG. 4 illustrates respective exemplary gate control signals Q0-Q5 of the first to sixth controllable semiconductor switches 201-206 during operation under Regime 1 (the case Pvdd<2*Vdd). The generation of the depicted gate control signals Q0-Q5 leads to the first, second and third converter states of the present embodiment of the power converter. In the first converter state 401, the second, fourth and fifth switches (202, 204 and 205) are placed in conducting states by the control circuit 102 while the first, third and sixth switches (201, 203 and 206) are placed in non-conducting states. The resulting current or conducting paths of this first converter state are illustrated with thick black lines 511, 512 in FIG. 5. In the first converter state, the voltage level or potential at the second DC output voltage is maintained at ½Pvdd by virtue of a shorting with the boost inductor L1 (211). The boost inductor L1 is charging in this first converter state because of the condition/regime Pvdd<2*Vdd which means that the second DC output voltage at node 225 is lower than the DC voltage of Vdd. The second smoothing capacitor, C3, is also charged in this state up to approximately ½Pvdd. As outlined in detail below, the voltage across the pump capacitor C2 is also ½Pvdd, and accordingly, the voltage level of the first DC output voltage at the first output node 224 is Pvdd. The latter feature can be understood by noting that C2 is connected in series with C3 which is at a voltage level potential of ½Pvdd as described above. The potential or voltage at the first output node 224 is maintained by the charge of the smoothing capacitor C4.

The charging of the smoothing capacitor C4 is described in further detail below. The skilled person will appreciate the operation of the pump capacitor C2 supports the above-mentioned voltage relationship between the first and second DC output voltages where the voltage level of the former voltage automatically is adjusted to be substantially twice the latter (again, within a margin due to the charging and discharging of the circuit elements under load).

Figure 6:
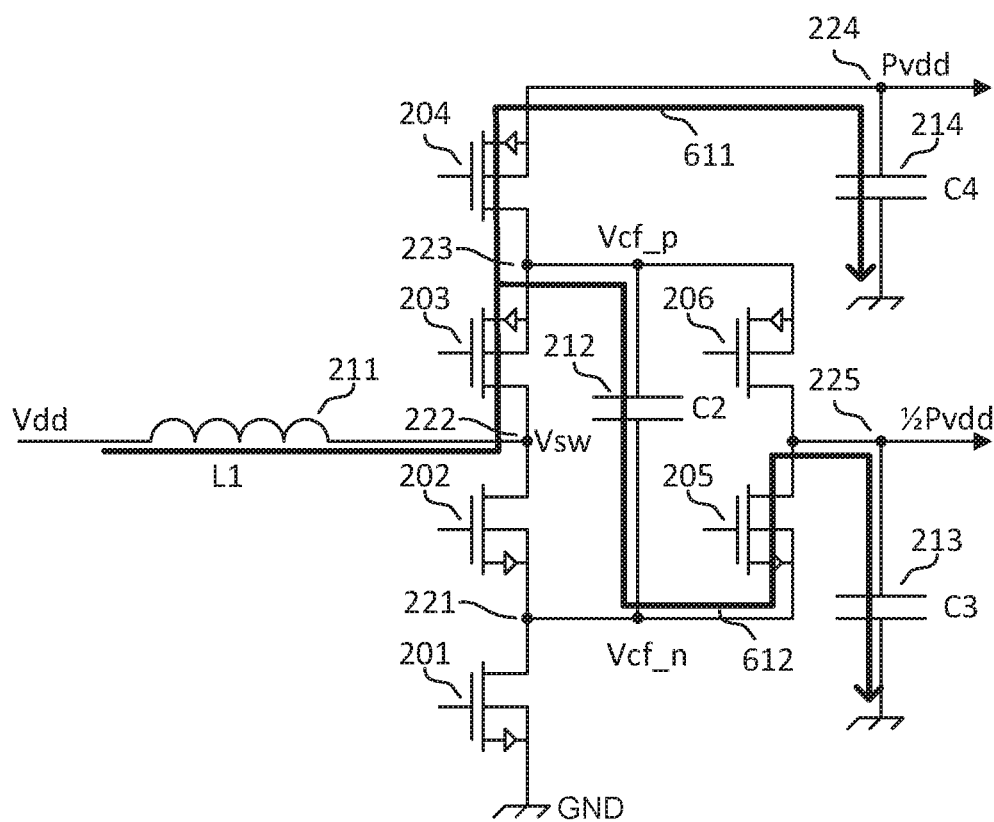

After a certain time interval, as determined by the control circuit, the converter circuit is switched to a second converter state, illustrated by the respective logic levels of the gate control signals of FIG. 4 at time instant 402a. The corresponding current paths 611, 612 through the switch arrangement in the second converter state are illustrated on FIG. 6. In the second converter state, the first DC output voltage at the first output node 224 and the capacitor C4 coupled to this node 224 are charged by the discharge of stored current/energy from the boost inductor L1 through the current path 612. Furthermore, the second capacitor C3 (213) at the second output node 225 (at the second DC output voltage ½Pvdd) is also charged by the discharge of current from the boost inductor L1 through another current path 611. The latter current path 661 extends through the conducting states or on states of the third and fifth semiconductor switches 203, 205 and through the pump capacitor C2. The conducting states of the third and fifth switches 203, 205 place the pump capacitor C2 and the smoothing capacitor C3 in series to ground. Furthermore, due to the conducting state of the fourth switch 204 the series connection of the pump capacitor C2 and the smoothing capacitor C3 is coupled in parallel to the smoothing capacitor C4 at the first DC output voltage Pvdd. The skilled person will appreciate that the voltage across the series connected pump capacitor C2 and smoothing capacitor C3 is forced to the DC voltage level at the first DC output voltage Pvdd resembling a charge transfer state of a conventional charge pump power converter. Hence, the configuration or setting of the semiconductor switch arrangement in the second converter state allows the discharge current from the boost inductor L1 to simultaneously charge both the first DC output voltage Pvdd and the second DC output voltage ½Pvdd and at the same time charge the series connected pump capacitor C2 and smoothing capacitor C3 to the first DC output voltage Pvdd.

Figure 7:
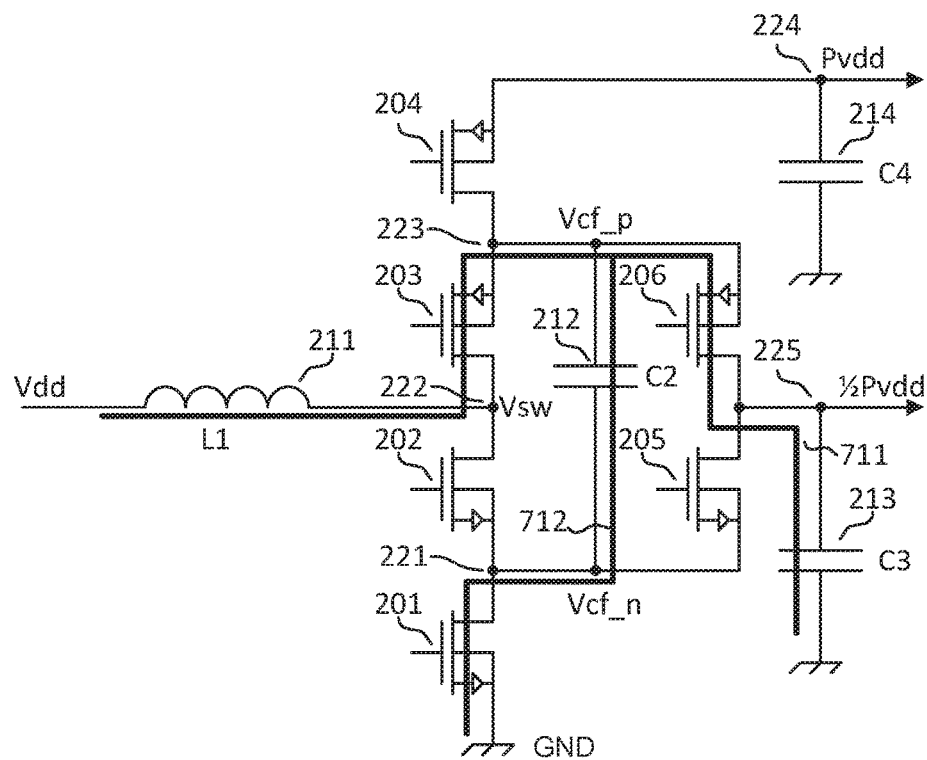

After a certain second time interval, as determined by the control circuit, the converter circuit is switched to a third converter state, illustrated by the respective logic levels of the gate control signals of FIG. 4 at time instant 403. The corresponding current paths 711, 712 through the switch arrangement in the third converter state are illustrated by the thick lines on FIG. 7. In the third converter state, pump capacitor C2 and smoothing capacitor C3 are placed in parallel due to the conducting states of the first switch 201 and the sixth switch 206 while the fifth switch 205 is off or non-conducting. The pump capacitor C2 and smoothing capacitor C3 are accordingly subjected to charge redistribution in the third state. The boost inductor L1 is also charged in this third converter state as was the case in the first converter state (refer to FIG. 5), but the current paths are different. The first DC output voltage is powered by charge held on the smoothing capacitor C4. The second DC output voltage ½Pvdd is powered by the capacitors C2 and C3, as well as by the boost inductor L1. Since the pump capacitor C2 is arranged in parallel with C3, the pump capacitor C2 is charged to ½Pvdd as mentioned above in connection with the disclosure of the first converter state.

In the present embodiment of the power converter 100, the control circuit 102 is preferably configured to switch back to the second converter state 402a when exiting the third converter state and subsequently revert to the first converter state 401 for completing the switching cycle according to Regime 1 as illustrated on FIG. 4. Consequently FIG. 4 illustrates several complete switching cycles according to Regime 1.

As schematically illustrated by FIG. 1, the first DC output voltage Pvdd may be used as feedback voltage or sense voltage for the voltage regulation loop. The switching cycle is in part determined by the respective loads on the first and second DC output voltages. If the load on e.g. the first DC output voltage increases, the smoothing capacitor C4 must be recharged more frequently to keep the voltage level if Pvdd within a certain target range or bound. Similarly, if the respective loads of the first and second DC output voltages increase, the capacitor C3 likewise needs to be recharged more frequently.

However, even where first DC output voltage is largely unloaded, the first DC output voltage can still be successfully used as feedback voltage and gauge the need for recharging. The reason is that the operation of the third converter state (illustrated by FIG. 7), ensures charge redistribution between the capacitors C2 and C3. A high load on the second DC output voltage held by C3 will cause a reduction of the voltage across C2. When the power converter circuit transits back to the first converter state (illustrated by FIG. 5), charge is redistributed between the capacitors C2 and C4, and the voltage level at the first DC output voltage will therefore be reduced even though there is substantially no load at the first DC output voltage. Accordingly, a switch of converter state will be performed by the control circuit because the control circuit detects a reduction of the voltage level at the first DC output voltage.

There exists a relationship between the capacitance values of the capacitors C2, C3 and C4, the boost inductor value and the required switching cycle pattern. If the capacitors C2, C3 and C4 have too small capacitances, the performance of the power converter may be negatively impacted because circuit impedances increase. Reducing the capacitor capacitances also requires faster switching cycles in order to allow the target or desired DC output voltages to be maintained with the predetermined limits. Voltage ripple of the first and second DC output voltages increases as well due to the relatively small charge available at the output voltage nodes 225, 224. On the other hand, if the capacitances of the capacitors C2, C3 and C4 are increased, the charging times increase as well, which in turn increases the start-up charging time of the power converter as well as the charging times needed during operation of the DC-DC voltage converter. As far as the present invention is concerned, the proper balance between these properties is a matter of design and the optimum capacitances are readily determined by suitable experimentation and/or simulation by the skilled person when faced with a particular use case and performance constraints.

Figure 8:
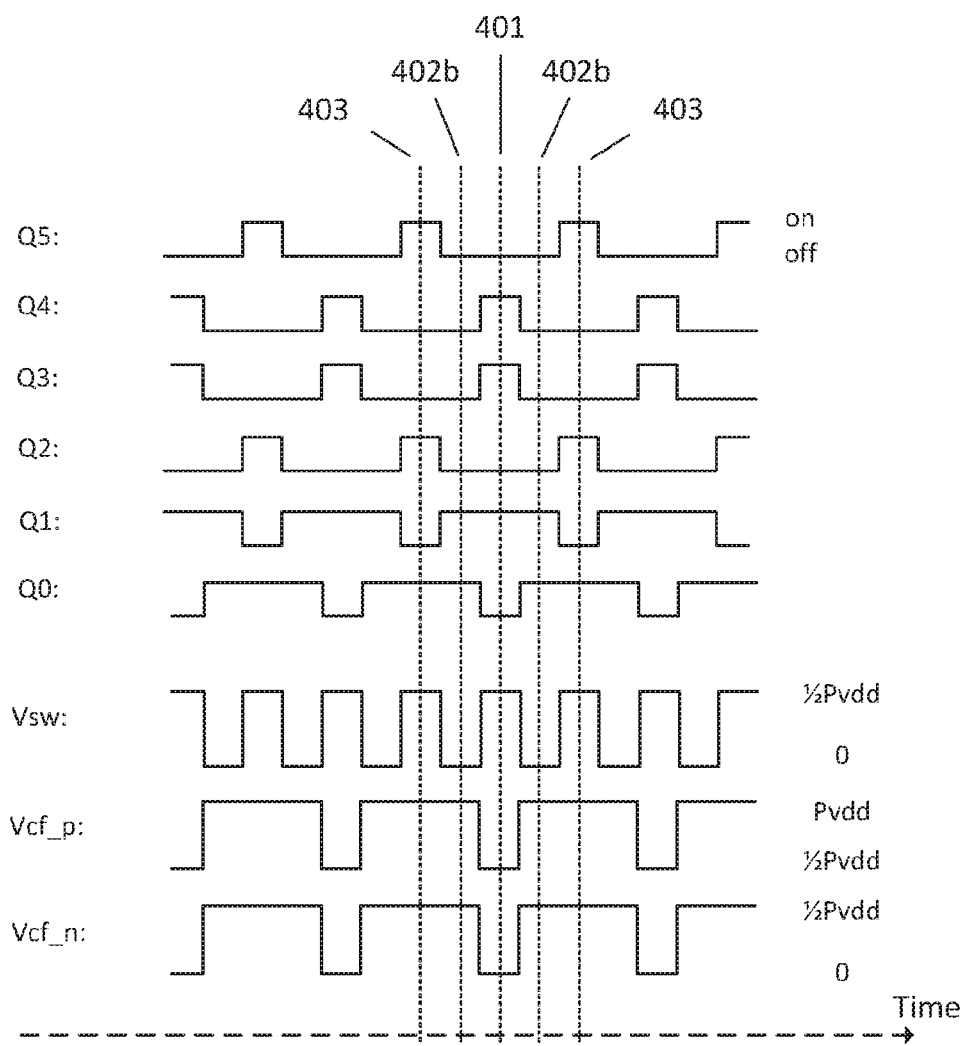
FIG. 8 illustrates exemplary gate control signals for achieving a boost factor of 4 of the dual-output boost DC-DC power converter.

The Control Circuit:

FIGS. 4 and 8 show schematically logic gate control signals of the semiconductor switches 201-206 generated by the control circuit to obtain the converter states and state switching described above. The gate control signals are shown as "on" and "off", meaning that the associated switches are in a conducting or in a non-conducting state, respectively. Different switch types require different polarities and levels of the gate control signals in order to be "on" or "off", and thus the actual gate voltages are different for different switch types. In a practical implementation of the control circuit, the illustrated logical gate control signals must accordingly be translated into gate control voltages or potentials that realize the desired on and off states.

The exemplary embodiment of the control circuit 301 depicted on FIG. 3 illustrates schematically a comparison between a target DC voltage, Vref, and the instantaneous voltage level of the first DC output voltage, nominally Pvdd. When the voltage level or potential at the first DC output voltage falls below a certain DC target voltage, represented in FIG. 3 by Vref, the modulation signal Vmod is adjusted to ensure charging of the capacitors C2, C3 and C4 and the boost inductor L1. In the exemplary embodiment, the control circuit provides, via a voltage controller 302, a signal representing a difference between the first DC output voltage Pvdd of the power converter circuit and a DC target voltage Vref.

The voltage controller generates a modulation signal Vmod which is applied to a pair of comparators 311 and 312. These comparators 311 and 312 are configured to compare the modulation signal Vmod with respective complementary ramp signals 304a and 304b to provide two pulse-width modulation signals to the gate driver 320. The gate driver 320 in turn generates the previously discussed gate control signals Q0-Q5 which are used for switching the converter circuit between the first, second and third converter states via the semiconductor switches 201-206. The present embodiment thus uses two PWM phases for providing the required gate control signals. The outputs of the two comparators are represented by gate control signals or voltages Q3 and Q2, respectively, in FIGS. 4 and 8. The remaining gate control signals, Q0, Q1, Q4, and Q5, are derived in a logic circuit section based on the gate control signals Q2 and Q3.

The example depicted in FIG. 3 uses a voltage mode controller and two ramp signals 304a, 304b. The ramp signals 304a, 304b of the control circuit are shown as substantially triangular waveforms, but other waveform types, for instance sawtooth carriers or inverted sawtooth carriers, can also be used in a number of applications. The scope of the claims is not limited to the schematic implementation shown in FIG. 3. The nature of the provision of the various converter states is merely a matter of design, with which the person skilled in the art is familiar with.

The control circuit also handles switching frequencies as necessary according to the desired characteristics/tolerance requirements of performance metrics such as ripple currents at one or both outputs.

Regime 2: Pvdd>2*Vdd

Figure 9:
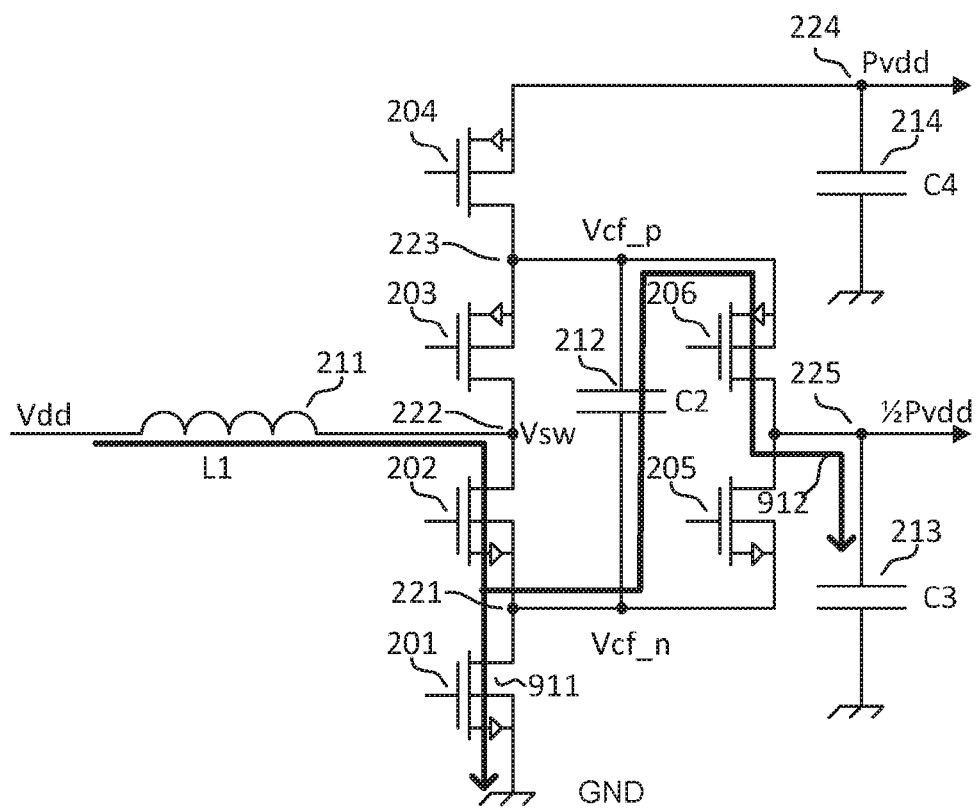
FIG. 9 illustrates a current or conducting path of an alternative second converter state resulting at higher boost levels.

Under Regime 2 operation, the power converter circuit is unable to charge the boost inductor L1 by the previously described, i.e. Regime 1, flow of charging current between the boost node 222 and the second DC output voltage. Instead, the boost node 222 is preferably connected, via conducting first and second switches 201, 202, to the DC reference potential, e.g. GND, rather than to ½Pvdd. This state of the switch arrangement represents an alternative second converter state, or fourth converter state, compared to the second converter state described for Regime 1 operation. FIG. 8 illustrates respective exemplary gate control signals Q0-Q5 of the first to sixth controllable semiconductor switches 201-206 during operation according to Regime 2 (the case Pvdd>2*Vdd). Differences in terms of current paths between the alternative second converter state and the second/fourth converter state discussed above are found in the second converter state. The first and third converter states at time instants 401 and 403 are the same under Regime 1 and Regime 2 operation which is evident by comparing FIG. 4 and FIG. 8. However, the first and second switches 201, 202 are turned on or conducting in the alternative second converter state while the third, fourth, fifth and sixth switches 203, 204, 205 and 206 are switched off or non-conducting. This alternative second converter state at time instant 402b is illustrated in FIG. 8. Under Regime 1 operation, shown in terms of the gate control signals of FIG. 4, the first and second switches are off/non-conducting corresponding to the state at time instant 402a of FIG. 4. The current paths 911, 912 of the alternative second converter state of Regime 2 are illustrated by FIG. 9. The boost inductor L1 is connected to the DC reference potential through the conducting first and second switches 201, 202 of the current path 911 and the pump capacitor C2 is connected in series with the smoothing capacitor C3 via the current path 912.

As described above, the first and third converter states utilize the same current paths. A comparison of the gate control signals between Regime 1 (FIG. 4) and Regime 2 (FIG. 8) shows inter alia that the change in current path is a result of a change in the duty cycle of the gate control signals. The on-time for the first and second switches 201, 202, for instance, increases with the first and second output voltages. In FIG. 4, which relates to Regime 1 operation, the duty cycle of each of the gate control signals of the first and second switches is roughly 20%. In FIG. 8, which relates to Regime 2 operation, the duty cycle of each of the first and second switches is roughly 80%. Note that the gate control signals are provided by the very same circuit topology; only the operating conditions differ. Thus, no change of the circuit topology of the semiconductor switch arrangement (101) is required to transit to Regime 2 operation. The control circuit will automatically increase the duty cycle and eventually transit from the second converter state to the alternative second converter state depicted on FIG. 9 which involves charging of boost inductor L1 via the DC reference potential.

In the first converter state of Regime 2 operation, the pump capacitor C2 charges the first output or smoothing capacitor C4 which is the only way C4 can be charged in Regime 2. In Regime 1, C4 is in contrast charged by the boost inductor L1 during the first and second converter states at time instants 401 and 402a. In the third converter state, capacitors C2 and C3 are coupled in parallel and both recharged by current supplied by the boost inductor L1. The consequence of this situation is that the required charging time in Regime 2 cannot be determined while the boost inductor L1 is charging. When the power converter is switched from the second converter state at time instant 402b to the first converter state at instant 401, or a third converter state at instant 403, the capacitors are recharged by the boost inductor L1 and the control circuit may adjust the duty cycle as required.

Figure 10:
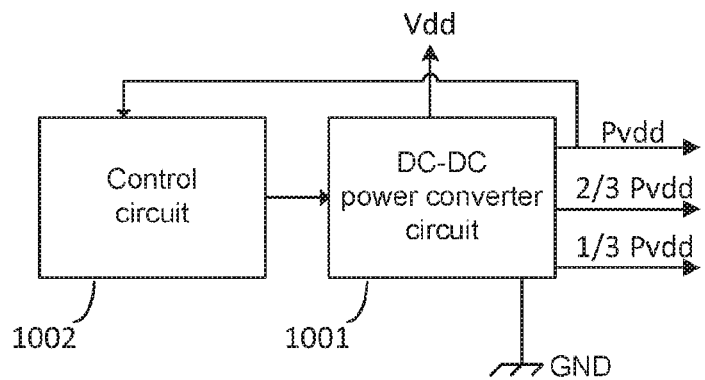
FIG. 10 illustrates a tri-level output boost DC-DC power converter in accordance with an embodiment of the invention.

FIG. 10 shows a schematic block diagram of a tri-level output boost DC-DC power converter 1000 in accordance with another embodiment of the invention. The tri-level output boost DC-DC power converter 1000 comprises a DC-DC power converter circuit 1001 and a control circuit 1002 coupled to and controlling the operation of the DC-DC power converter circuit 1001.

Figure 11:
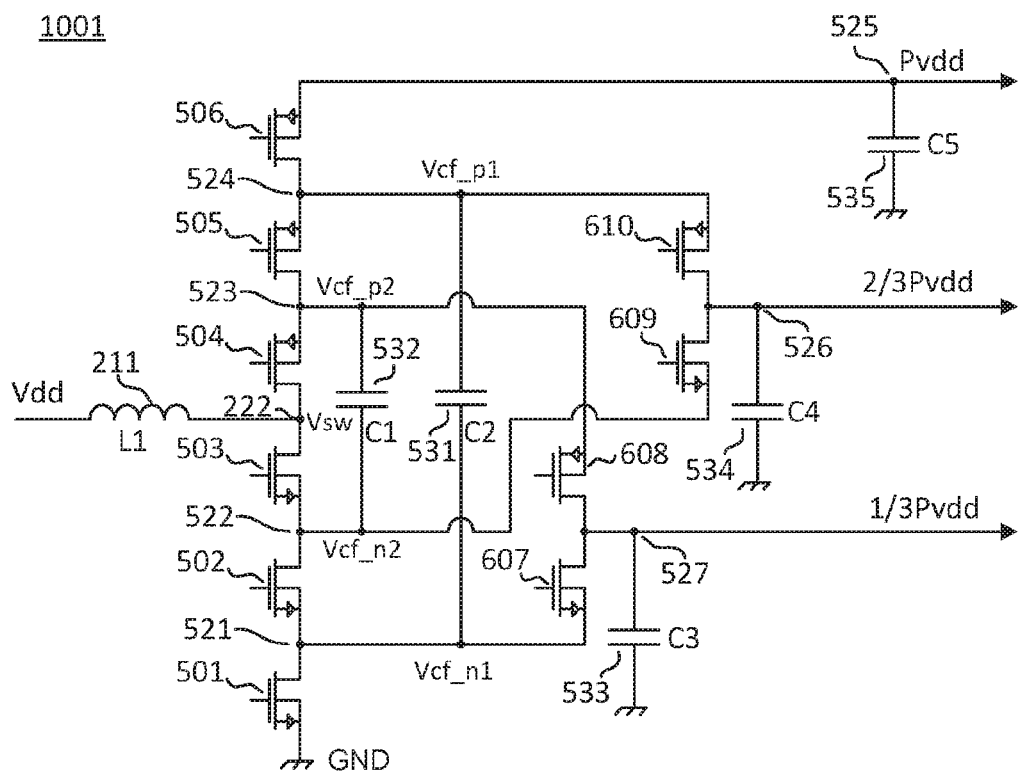
FIG. 11 illustrates a transistor level block diagram of a tri-level output boost DC-DC power converter circuit for use in the tri-level output boost DC-DC power converter depicted in FIG. 10.

FIG. 11 illustrates an exemplary embodiment of the tri-level output boost DC-DC power converter circuit 1101 of the tri-level output boost DC-DC power converter 1000 of FIG. 10. The tri-level output DC-DC power converter circuit shares certain features with the dual-output DC-DC power converter circuit described above. The tri-level output DC-DC power converter circuits also comprises a first lower leg and a second upper leg joined at a boost node 222. Where the dual-output boost DC-DC power converter circuit of FIG. 2 comprises a single boost or floating capacitor C2, the tri-level output boost DC-DC power converter circuit 1001 of FIG. 11 comprises two separate boost/flying capacitors C1 and C2 which are connected to separate pairs of intermediate nodes of the first and second legs. The first leg of the semiconductor switch arrangement comprises first, second and third semiconductor switches 501, 502, 503 connected in series or cascade between a DC reference potential, i.e. ground/GND in the present embodiment, and a boost node 522. The semiconductor switch arrangement further comprises a second leg comprising third, fourth and fifth semiconductor switches 504, 505, 506 connected in series or cascade between the boost node 522*a* and a first DC output voltage Pvdd at a first output node 525. The first leg comprises a first intermediate node 521 placed at the junction node of the first and second semiconductor switches and a second intermediate node 522 placed at a junction node of the second and third semiconductor switches. The second leg likewise comprises a third intermediate node 523 placed at the junction node of the fourth and fifth semiconductor switches and a fourth intermediate node 524 placed at a junction node of the fifth and sixth semiconductor switches. The boost inductor L1 has a first end coupled to a DC input voltage supply Vdd and a second end coupled to the boost node 522*a*. The first pump capacitor C1 is coupled between the second intermediate node 522 and the third intermediate node 523 and the second pump capacitor C2 is coupled between the first intermediate node 521 and the fourth intermediate node 524. As discussed in further detail below, the semiconductor switch arrangement comprises a numerous further semiconductor switches 607, 608, 609, 610.

The one or more boost capacitors (212, 531, 532) are selectively switched to be charged and/or to provide charge to their respective output nodes. Compared to the dual-output embodiment of FIG. 2, the tri-level embodiment of FIG. 11 comprises a further capacitor for storing further energy to provide a further DC output voltage. In the three-level power converter, capacitor 212 provides for dual-output via nodes 224 and 225. In the tri-level power converter circuit in FIG. 11, two capacitors, namely capacitor 531 and capacitor 532, are selectively charged or discharged in respective charging and discharging states through which the control circuit cycles the switches in order to obtain the desired four output levels (including the DC reference voltage).

Figure 13:
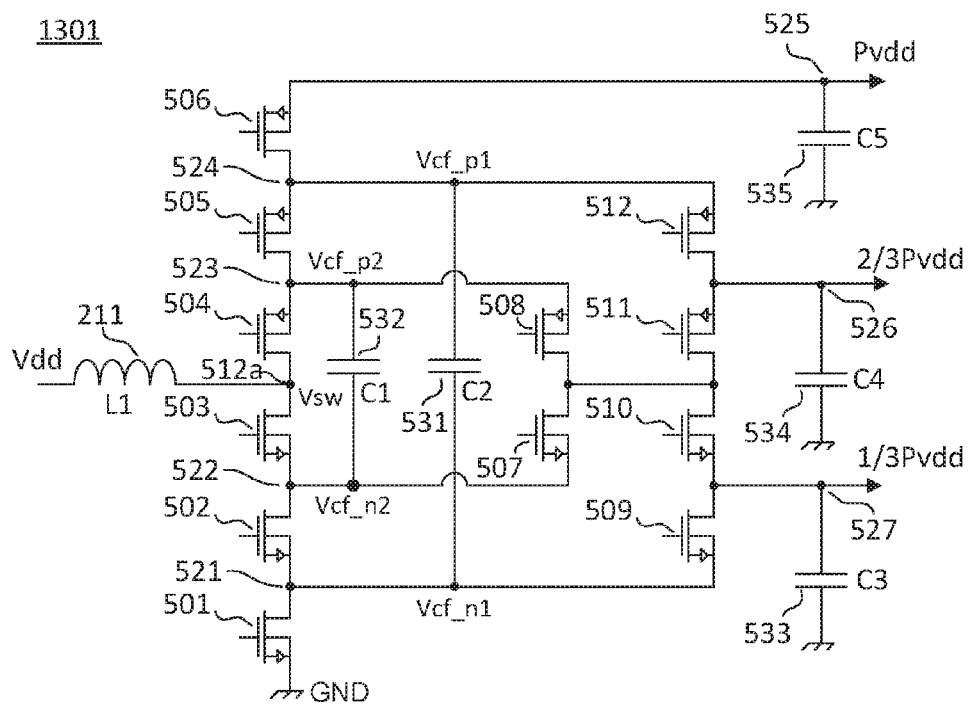
FIG. 13 illustrates another transistor level block diagram of a tri-level output boost DC-DC power converter circuit for use in the tri-level output boost DC-DC power converter depicted in FIG. 10.

FIG. 13 illustrates another tri-level output boost DC-DC power converter circuit 1301 for use as DC-DC power converter circuit 1001 of the tri-level output boost DC-DC power converter 1000 of FIG. 10.

Based on the present disclosure, in particular the disclosure of the dual-level and tri-level output DC-DC power converters in FIGS. 2, 11 and 13, the general inventive concept presented in this specification may be extended to provide 4-level, 5-level (and so on) boost DC-DC power converters.

Figure 12A:
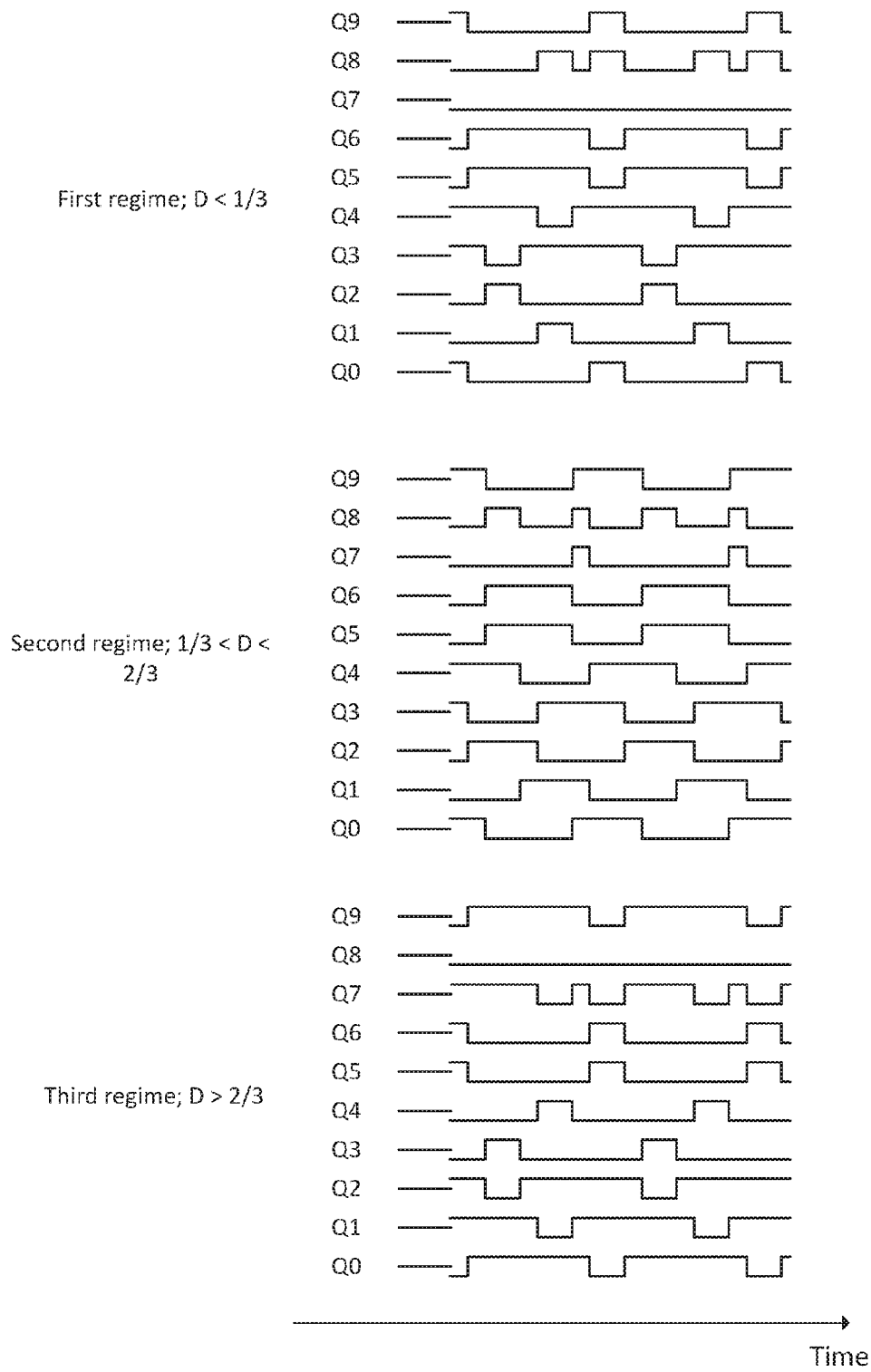
FIG. 12a illustrates gate control signals provided by the control circuit of FIG. 10 for operating the DC-DC power converter circuit of FIG. 11.
Figure 12B:
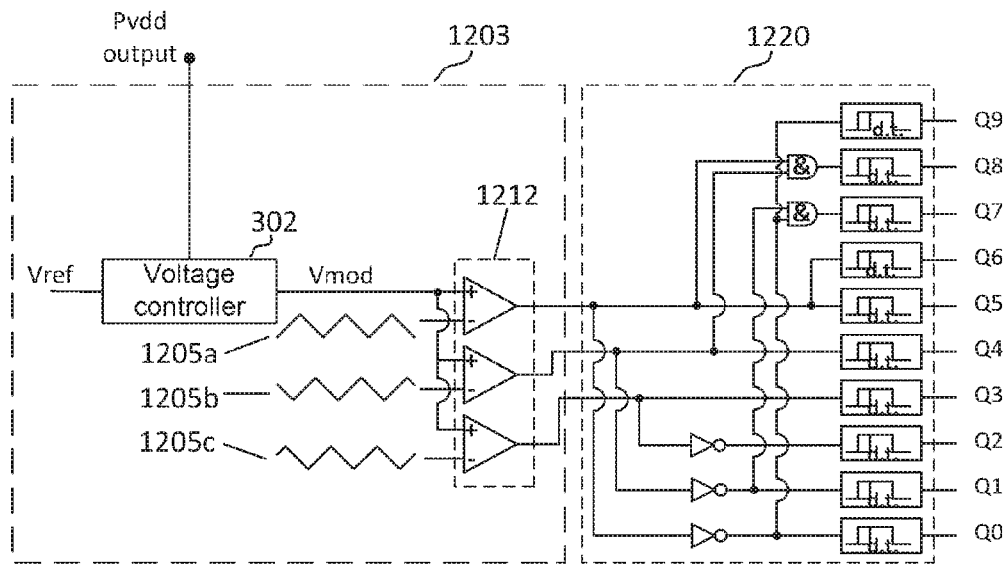

FIG. 12*a* shows examples of control signals for controlling the semiconductor switches in the of the -DC power converter circuit 1001 of FIG. 11 in order to obtain a tri-level output. D is the duty cycle of the first semiconductor switch 501 in FIG. 11. The control circuit in FIG. 10 is configured to generate gate control signals Q0-Q9 which are used for switching the converter circuit 1001 between a series of converter states via switches 501-506, 607-610 (see FIG. 11), respectively. These gate control signals can be provided for instance by the control circuit 1202 such as that in FIG. 12*b*. The control circuit 1202 is similar to that described in relation to the dual-output boost DC-DC power converter above in expect for the use of three comparators 1212. The three comparators 1212 compare the modulation signal Vmod with respective ramp signals 1205*a*, 1205*b* and 1205*c*, which are relatively phase shifted by 120 degrees. A gate driver 1220 provides the required gate signals Q0-Q9.

Figure 14A:
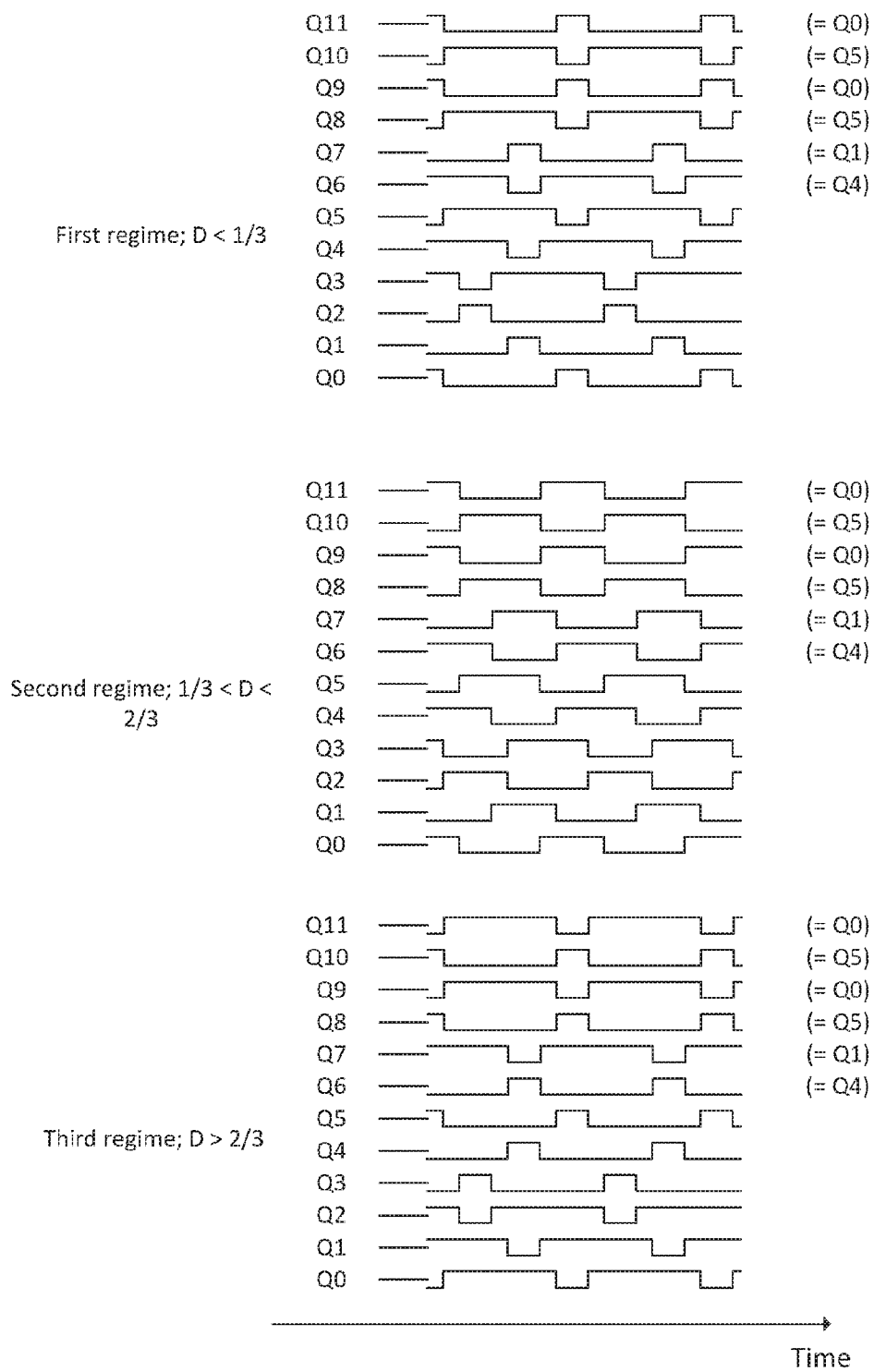
FIG. 14a illustrates gate control signals provided by the control circuit of FIG. 10 for operating the DC-DC power converter circuit of FIG. 13.
Figure 14B:
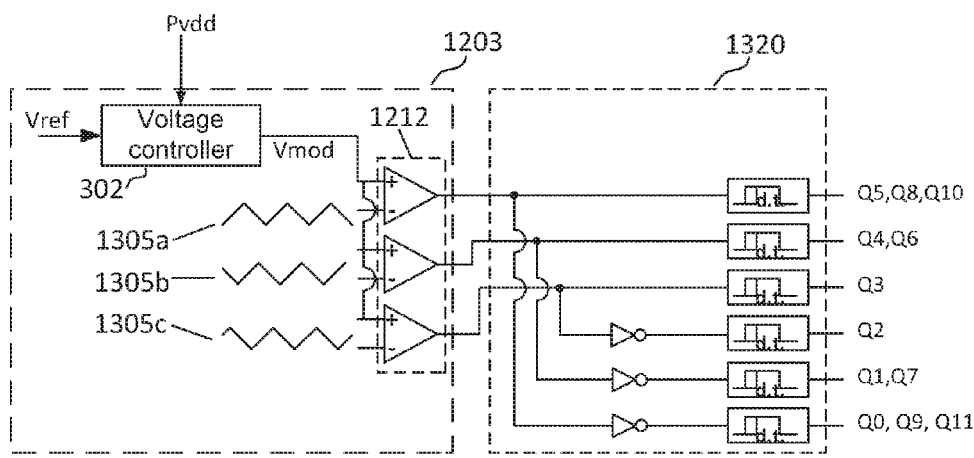

Similarly, FIG. 14*a* shows the control signals for controlling the semiconductor switches of the converter circuit 1301 of FIG. 13 in order to obtain a tri-level output from that circuit. D is the duty cycle of the first semiconductor switch 501 of FIG. 13. The control circuit in FIG. 10 provides gate control signals Q0-Q11 which are used for switching the semiconductor switch arrangement (501, 502, 503, 504, 505, 506, 507, 506, 509, 510, 511, 512) of the converter circuit 1301 between a series of converter states via switches 501-510 (see FIG. 13). These gate control signals can be provided for instance by the exemplary control circuit 1302 depicted on FIG. 14*b*. The control circuit 1302 is similar to that described in relation to the tri-level output boost DC-DC power converter above. The control circuit 1302 uses three comparators 1212 which compare the modulation signal Vmod with respective ramp signals 1305*a*, 1305*b* and 1305*c*, which are relatively phase shifted by 120 degrees. A gate driver 1320 provides the required gate signals Q0-Q11. The logic circuitry utilized by the gate driver 1220 of FIG. 12*b* and gate driver 1320 of FIG. 14*b* are somewhat different, which reflect differences in architecture between the two tri-level output boost DC-DC power converter circuits 1101 and 1301 of FIGS. 11 and 13. Similar to the dual-level boost DC-DC power converter, the switching between states may advantageously be initiated based on a comparison of a DC output voltage, such as the first DC output voltage, with a DC target voltage.

Figure 15:
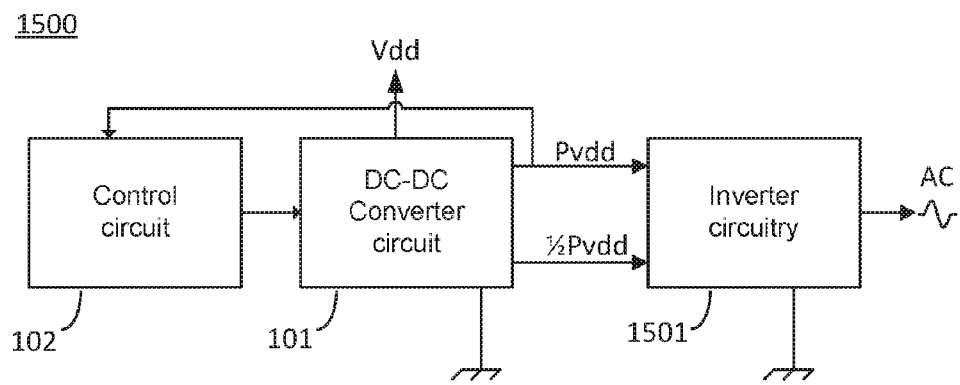
FIG. 15 illustrates a three-level inverter employing the dual-output boost DC-DC power converter shown in FIG. 1.

Power Inverters:

FIG. 15 illustrates a dual-level power inverter 1500 that employs the previously discussed embodiment of the dual-output boost DC-DC power converter 100 described above. Inverter circuitry 1501 is connected to the DC reference potential, e.g. ground as indicated, and to the first and second DC output nodes 224 and 225 (see FIGS. 1 and 2). The inverter circuitry uses the first and second DC output voltages at nodes 224 and 225 and the DC reference potential provided by the dual-output boost DC-DC converter to generate an AC output. Another embodiment of the power inverter employs a tri-level output boost DC-DC power converter such as that of FIG. 10, which in turn employs appropriate tri-level DC-DC power converter circuits as described above. More generally, the inverter is based on an embodiment of the multiple output boost DC-DC power converter having first and second legs comprising N semiconductor switches, in accordance with the first aspect of the invention.

Figure 16:
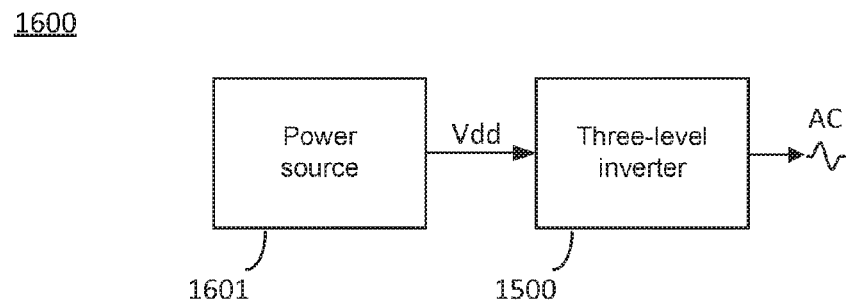
FIG. 16 illustrates an alternating current (AC) generator employing a power source and the three-level inverter shown in FIG. 15.

AC Generators:

FIG. 16 illustrates an AC generator 1600 that employs the dual-level inverter 1500 shown on FIG. 15, and a suitable power generator 1601. The power generator 1601 may comprise a wind turbine or solar panel or wave-based energy harvesting apparatus. The power from the power generator 1601 is used as an input voltage supply to the dual-output boost DC-DC power converter circuit part 101 of the dual-level inverter 1500. The output is an alternating current, AC.

Audio Amplifiers

Figure 17:
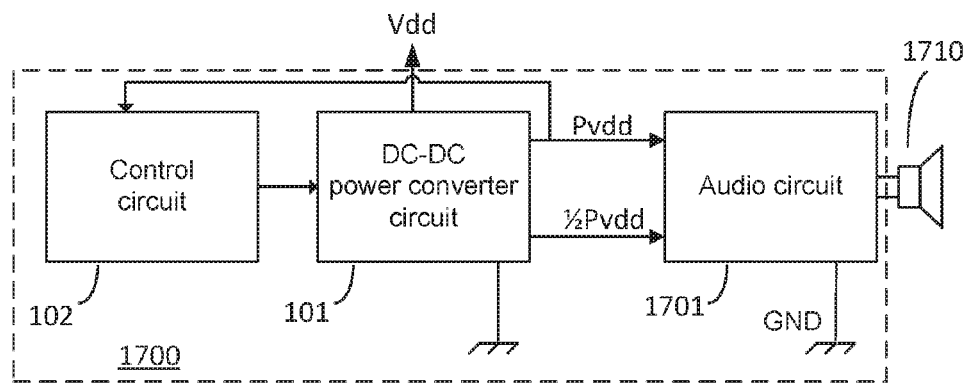
FIG. 17 illustrates a class D audio power amplifier comprising a multiple output DC-DC power converter.

FIG. 17 illustrates a class D audio power amplifier 1700 comprising a multiple output DC-DC power converter (100, 1000) and an audio circuit 1701 having a first (GND), a second (PVdd) and a third (½Pvdd) voltage supply rail coupled, respectively, to: the DC reference potential, the first DC output voltage and the second DC output voltage. The audio circuit comprises an output connectable to a speaker load 1710.

The invention claimed is:

1. A multiple output boost DC-DC power converter comprising a semiconductor switch arrangement comprising:
   a first leg comprising N semiconductor switches connected in series, where N is an integer higher than 1, a first end of the first leg being connected to a DC reference potential, a second end of the first leg being connected to a boost node,
   a second leg comprising N semiconductor switches connected in series, a first end of the second leg being connected to the boost node and a second end of the second leg being connected to a first output node for supplying a first DC output voltage of the DC-DC power converter,
   an inductor having a first end connected to the boost node and a second end connectable to a DC input voltage supply,
   a first capacitor having a first end connected to a first intermediate node of the first leg and having a second end connected to a second intermediate node of the second leg,
   a first further semiconductor switch for selectively coupling or decoupling a second output node to the first end of the first capacitor, for supplying a second DC output voltage via the second output node,
   a second further semiconductor switch for selectively coupling or decoupling the second output node or, if present, a third output node to the second end of the first capacitor,
   a second capacitor connected between the DC reference potential and the second output node,
   a third capacitor connected between the DC reference potential and the first output node;
   a control circuit coupled to respective control terminals of the semiconductor switches of the semiconductor switch arrangement, the control circuit being configured to:
   place the semiconductor switch arrangement in a first charge configuration for charging the inductor through a first current path extending from the boost node to at least one of the second output node and the DC reference potential,
   place the semiconductor switch arrangement in a first discharge configuration for discharging the inductor through a second current path extending through the first capacitor to the second output node,
   place the semiconductor switch arrangement in a second discharge configuration for discharging the inductor through a third current path extending from the boost node either directly through the second leg to the first output node or through the first capacitor and at least one semiconductor switch of the first leg and one semiconductor switch of the second leg.

2. The multiple output boost DC-DC power converter in accordance with claim 1, wherein the control circuit is configured to:
   place the first capacitor and the second capacitor in series via the semiconductor switch arrangement in at least one of the first and second discharge configurations; and
   place the first capacitor and the second capacitor in parallel via the semiconductor switch arrangement in at least the first charge configuration.

3. The multiple output boost DC-DC power converter in accordance with claim 1, wherein the control circuit is configured to (a) in a first regime of operation where the first output voltage is smaller than two times the DC input voltage supply:
   place the semiconductor switch arrangement in a first converter state for charging the inductor through a first current path extending from the boost node to the second output node and through a second current path extending from the boost node through the first capacitor to the first output node; and to node, and to
   place the semiconductor switch arrangement in a second converter state for discharging the inductor through a third current path extending from the boost node to the first output node and through a fourth current path extending from the boost node through the first capacitor to the second output node,
   place the semiconductor switch arrangement in a third converter state for charging the inductor through a fifth current path extending from the boost node to the second output node and through a sixth current path extending from the boost node through the first capacitor to the DC reference potential;
   or wherein the control circuit is configured to, (b) in a second regime of operation where the first output voltage is larger than two times the DC input voltage supply:
   place the semiconductor switch arrangement in fourth converter state for charging the inductor through a seventh current path extending from the boost node to the DC reference potential and through an eight current path extending from the boost node through the first capacitor to the second output node, and to
   place the semiconductor switch arrangement in the third converter state for discharging the inductor through the fifth and sixth current paths, and to
   place the semiconductor switch arrangement in the first converter state for discharging the inductor through the first and second current paths.

4. The multiple output boost DC-DC power converter in accordance with claim 1, wherein
   the first leg comprises a first semiconductor switch having a first end connected to the DC reference potential and having a second end connected to the first intermediate node,
   the first leg further comprises a second semiconductor switch having a first end connected to the first intermediate node and having a second end connected to the boost node,
   the second leg comprises a third semiconductor switch having a first end connected to the boost node and having a second end connected to a second intermediate node,
   the second leg further comprises a fourth semiconductor switch having a first end connected to the second intermediate node and having a second end connected to the first output node,
   the first end of the first capacitor is connected to the first intermediate node, and the second end of the first capacitor is connected to the second intermediate node,
   the first further semiconductor switch is a fifth semiconductor switch having a first end connected to the first end of the first capacitor and having a second end connected to the second output node,
   the second further semiconductor switch is a sixth semiconductor switch having a first end connected to the second output node, and having a second end connected to the second end of the first capacitor.

5. The multiple output boost DC-DC power converter according to claim 1, wherein:
the first leg comprises a first semiconductor switch having a first end at the DC reference potential and having a second end connected to the first intermediate node,
the first leg comprises a second semiconductor switch having a first end connected to the first intermediate node and having a second end connected to the second intermediate node,
the first leg comprises a third semiconductor switch having a first end connected to the second intermediate node and having a second end connected to the boost node,
the second leg comprises a fourth semiconductor switch having a first end connected to the boost node and having a second end connected to a third intermediate node,
the second leg comprises a fifth semiconductor switch having a first end connected to the third intermediate node and having a second end connected to a fourth intermediate node,
the second leg comprises a sixth semiconductor switch having a first end connected to the fourth intermediate node and having a second end connected to the first output node,
the first end of the first capacitor is connected to the first intermediate node, and the second end of the first capacitor is connected to the fourth intermediate node,
a first end of a fourth capacitor is connected to the second intermediate node, and a second end of the fourth capacitor is connected to the third intermediate node,
the first further semiconductor switch is a seventh semiconductor switch having a first end connected to the first end of the first capacitor and having a second end connected to the second output node,
the second further semiconductor switch is an eighth semiconductor switch having a first end connected to a third output node and having a second end connected to the second end of the first capacitor, the third output node providing for a third DC output voltage, and
the control circuit is operable to cause the multiple output boost DC-DC power converter to operate in a plurality of converter states for providing the first, second and third DC output voltages, where the third DC output voltage is substantially twice the second DC output voltage, and the second DC output voltage is substantially a third of the first DC output voltage,
the multiple output boost DC-DC power converter further comprises:
a ninth semiconductor switch having a first end connected to the second node and having a second end connected to the third output node, and
a tenth semiconductor switch having a first end connected to the second output node and having a having a second end connected to the third node.

6. The multiple output boost DC-DC power converter according to claim 3, wherein the control circuit is operable to cause the DC-DC power converter to switch between the first, second and third converter states in accordance with a predefined sequential scheme of: first converter state, second converter state, third converter state, second converter state, first converter state.

7. The multiple output boost DC-DC power converter according to claim 1, wherein the control circuit is configured to provide a level of the second DC output voltage which is substantially one half of a level of the first DC output voltage.

8. The multiple output boost DC-DC power converter according to claim 1, wherein each of the semiconductor switches of the semiconductor switch arrangement comprises at least one of: an n-channel MOSFET, a p-channel MOSFET, an IGBT and a bipolar junction transistor (BJT).

9. The multiple output boost DC-DC power converter according to claim 1, wherein a switching frequency of each of the semiconductor switches of the semiconductor switch arrangement lies within an interval 1 kHz-10 MHz, such as between 10 kHz and 10 MHz, such as between 10 kHz and 1 MHz.

10. The multiple output boost DC-DC power converter according to claim 1, further comprising a voltage regulation loop configured to minimize a difference between a DC target voltage and a signal representing one of: the first DC output voltage, the second DC output voltage or, if present, the third DC output voltage or any combination of the first DC output voltage and the second DC output voltage and the third DC output voltage.

11. The multiple output boost DC-DC power converter according to claim 10, further comprising:
a voltage controller having a first input coupled to the first, second or third output node and having a second input coupled to receive the DC target voltage, the voltage controller providing a modulation signal representing said difference,
a pulse-width modulator for generating two or more pulse-width modulated (PWM) signals based on the modulation signal from the voltage controller and based on a ramp signal, wherein a duty cycle of the pulse-width modulated signals change in response to the modulation signal in a direction acting to minimize said difference, and
a gate driver adapted to receive the pulse-width modulated signals and generate gate control signals based thereon, the gate control signals being adapted to make the DC-DC power converter operable to place the semiconductor switch arrangement in at least two of: the first configuration, the second configuration, the third configuration, the fourth configuration.

12. The multiple output boost DC-DC power converter according to claim 11, wherein the control circuit provides two, respectively three, PWM signals phase shifted with respect to one another by 180 degrees and 120 degrees, respectively, and the gate driver provides gate control signals for the semiconductor switches of the semiconductor switch arrangement based on the two, respectively three, PWM signals.

13. A class D audio power amplifier comprising a multiple output boost DC-DC power converter in accordance with claim 1, the class D audio power amplifier comprising an audio circuit having at least a first, a second and a third voltage supply rail coupled, respectively, to: the DC reference potential, the first DC output voltage and the second DC output voltage wherein the audio circuit further comprising an output connectable to a speaker load.

14. The multiple output boost DC-DC power converter in accordance with claim 2, wherein the control circuit is configured to (a) in a first regime of operation where the first output voltage is smaller than two times the DC input voltage supply:
place the semiconductor switch arrangement in a first converter state for charging the inductor through a first current path extending from the boost node to the second output node and through a second current path extending from the boost node through the first capacitor to the first output node; and to node, and to place the semiconductor switch arrangement in a second converter state for discharging the inductor through a third current path extending from the boost node to the first output node and through a fourth current path extending from the boost node through the first capacitor to the second output node, place the semiconductor switch arrangement in a third converter state for charging the inductor through a fifth current path extending from the boost node to the second output node and through a sixth current path extending from the boost node through the first capacitor to the DC reference potential;

or wherein the control circuit is configured to, (b) in a second regime of operation where the first output voltage is larger than two times the DC input voltage supply:

place the semiconductor switch arrangement in fourth converter state for charging the inductor through a seventh current path extending from the boost node to the DC reference potential and through an eight current path extending from the boost node through the first capacitor to the second output node, and to place the semiconductor switch arrangement in the third converter state for discharging the inductor through the fifth and sixth current paths, and to place the semiconductor switch arrangement in the first converter state for discharging the inductor through the first and second current paths.

15. The multiple output boost DC-DC power converter in accordance with claim 2, wherein
the first leg comprises a first semiconductor switch having a first end connected to the DC reference potential and having a second end connected to the first intermediate node,
the first leg further comprises a second semiconductor switch having a first end connected to the first intermediate node and having a second end connected to the boost node,
the second leg comprises a third semiconductor switch having a first end connected to the boost node and having a second end connected to a second intermediate node,
the second leg further comprises a fourth semiconductor switch having a first end connected to the second intermediate node and having a second end connected to the first output node,
the first end of the first capacitor is connected to the first intermediate node, and the second end of the first capacitor is connected to the second intermediate node,
the first further semiconductor switch is a fifth semiconductor switch having a first end connected to the first end of the first capacitor and having a second end connected to the second output node,
the second further semiconductor switch is a sixth semiconductor switch having a first end connected to the second output node, and having a second end connected to the second end of the first capacitor.

16. The multiple output boost DC-DC power converter in accordance with claim 3, wherein
the first leg comprises a first semiconductor switch having a first end connected to the DC reference potential and having a second end connected to the first intermediate node,
the first leg further comprises a second semiconductor switch having a first end connected to the first intermediate node and having a second end connected to the boost node,
the second leg comprises a third semiconductor switch having a first end connected to the boost node and having a second end connected to a second intermediate node,
the second leg further comprises a fourth semiconductor switch having a first end connected to the second intermediate node and having a second end connected to the first output node,
the first end of the first capacitor is connected to the first intermediate node, and the second end of the first capacitor is connected to the second intermediate node,
the first further semiconductor switch is a fifth semiconductor switch having a first end connected to the first end of the first capacitor and having a second end connected to the second output node,
the second further semiconductor switch is a sixth semiconductor switch having a first end connected to the second output node, and having a second end connected to the second end of the first capacitor.

17. The multiple output boost DC-DC power converter according to claim 2, wherein:
the first leg comprises a first semiconductor switch having a first end at the DC reference potential and having a second end connected to the first intermediate node,
the first leg comprises a second semiconductor switch having a first end connected to the first intermediate node and having a second end connected to the second intermediate node,
the first leg comprises a third semiconductor switch having a first end connected to the second intermediate node and having a second end connected to the boost node,
the second leg comprises a fourth semiconductor switch having a first end connected to the boost node and having a second end connected to a third intermediate node,
the second leg comprises a fifth semiconductor switch having a first end connected to the third intermediate node and having a second end connected to a fourth intermediate node,
the second leg comprises a sixth semiconductor switch having a first end connected to the fourth intermediate node and having a second end connected to the first output node,
the first end of the first capacitor is connected to the first intermediate node, and the second end of the first capacitor is connected to the fourth intermediate node,
a first end of a fourth capacitor is connected to the second intermediate node, and a second end of the fourth capacitor is connected to the third intermediate node,
the first further semiconductor switch is a seventh semiconductor switch having a first end connected to the first end of the first capacitor and having a second end connected to the second output node,
the second further semiconductor switch is an eighth semiconductor switch having a first end connected to a third output node and having a second end connected to the second end of the first capacitor, the third output node providing for a third DC output voltage, and
the control circuit is operable to cause the multiple output boost DC-DC power converter to operate in a plurality of converter states for providing the first, second and third DC output voltages, where the third DC output voltage is substantially twice the second DC output voltage, and the second DC output voltage is substantially a third of the first DC output voltage,
the multiple output boost DC-DC power converter further comprises:
a ninth semiconductor switch having a first end connected to the second node and having a second end connected to the third output node, and
a tenth semiconductor switch having a first end connected to the second output node and having a having a second end connected to the third node.

18. The multiple output boost DC-DC power converter according to claim 3, wherein:
the first leg comprises a first semiconductor switch having a first end at the DC reference potential and having a second end connected to the first intermediate node,
the first leg comprises a second semiconductor switch having a first end connected to the first intermediate node and having a second end connected to the second intermediate node,
the first leg comprises a third semiconductor switch having a first end connected to the second intermediate node and having a second end connected to the boost node,
the second leg comprises a fourth semiconductor switch having a first end connected to the boost node and having a second end connected to a third intermediate node,
the second leg comprises a fifth semiconductor switch having a first end connected to the third intermediate node and having a second end connected to a fourth intermediate node,
the second leg comprises a sixth semiconductor switch having a first end connected to the fourth intermediate node and having a second end connected to the first output node,
the first end of the first capacitor is connected to the first intermediate node, and the second end of the first capacitor is connected to the fourth intermediate node,
a first end of a fourth capacitor is connected to the second intermediate node, and a second end of the fourth capacitor is connected to the third intermediate node,
the first further semiconductor switch is a seventh semiconductor switch having a first end connected to the first end of the first capacitor and having a second end connected to the second output node,
the second further semiconductor switch is an eighth semiconductor switch having a first end connected to a third output node and having a second end connected to the second end of the first capacitor, the third output node providing for a third DC output voltage, and
the control circuit is operable to cause the multiple output boost DC-DC power converter to operate in a plurality of converter states for providing the first, second and third DC output voltages, where the third DC output voltage is substantially twice the second DC output voltage, and the second DC output voltage is substantially a third of the first DC output voltage,
the multiple output boost DC-DC power converter further comprises:
a ninth semiconductor switch having a first end connected to the second node and having a second end connected to the third output node, and
a tenth semiconductor switch having a first end connected to the second output node and having a having a second end connected to the third node.

19. The multiple output boost DC-DC power converter according to claim 4, wherein the control circuit is operable to cause the DC-DC power converter to switch between the first, second and third converter states in accordance with a predefined sequential scheme of: first converter state, second converter state, third converter state, second converter state, first converter state.

20. A multi-level power inverter comprising:
a multiple output DC-DC power converter in accordance with claim 1, and
inverter circuitry connected to the DC reference potential and to at least the first and second DC output voltage of the multiple output DC-DC power converter, and adapted to provide an alternating current output based thereon.

* * * * *